(12) United States Patent
Huang et al.

(10) Patent No.: US 9,077,289 B2
(45) Date of Patent: Jul. 7, 2015

(54) SELF-BIASED RECEIVER

(71) Applicant: QUALCOMM Incorporated, San Diego, CA (US)

(72) Inventors: Yu Huang, San Diego, CA (US); Thomas Clark Bryan, San Diego, CA (US); Mark Wayland, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 92 days.

(21) Appl. No.: 13/918,771

(22) Filed: Jun. 14, 2013

(65) Prior Publication Data
US 2014/0368276 A1 Dec. 18, 2014

(51) Int. Cl.
*H03F 3/45* (2006.01)
*H03F 3/193* (2006.01)
*H03F 1/30* (2006.01)

(52) U.S. Cl.
CPC .............. *H03F 3/193* (2013.01); *H03F 1/301* (2013.01)

(58) Field of Classification Search
CPC ........................................................ H03F 3/45
USPC .................................. 330/261, 260, 296, 285
See application file for complete search history.

(56) References Cited

U.S. PATENT DOCUMENTS

| 5,293,515 | A | 3/1994 | Uchida et al. |
| 5,942,940 | A | 8/1999 | Dreps et al. |
| 5,953,276 | A | 9/1999 | Baker |
| 6,118,318 | A | 9/2000 | Fifield et al. |
| 6,172,524 | B1 | 1/2001 | Cho |
| 6,392,453 | B1 | 5/2002 | Morzano et al. |
| 6,563,384 | B1 | 5/2003 | Brokaw |
| 7,176,720 | B1 | 2/2007 | Prather et al. |
| 2006/0012429 | A1 | 1/2006 | Kim |
| 2009/0322420 | A1 | 12/2009 | Singh |
| 2012/0049957 | A1* | 3/2012 | Chung ............... 330/253 |
| 2012/0049960 | A1* | 3/2012 | Hsu .................. 330/261 |
| 2012/0193519 | A1 | 8/2012 | Oomori |
| 2012/0206198 | A1 | 8/2012 | Meninger |
| 2014/0306760 | A1* | 10/2014 | Piepenstock et al. ...... 330/261 |

FOREIGN PATENT DOCUMENTS

| GB | 2343574 A | 5/2000 |
| GB | 2350246 A | 11/2000 |

OTHER PUBLICATIONS

Bazes M., "Two Novel Fully Complementary Self-Biased CMOS Differential Amplifiers", IEEE Journal of Solid-State Circuits,vol. 26,No. 2,1991 ,pp. 165-168.
International Search Report and Written Opinion—PCT/US2014/042259—ISA/EPO—Sep. 12, 2014.

* cited by examiner

*Primary Examiner* — Henry Choe
(74) *Attorney, Agent, or Firm* — Arent Fox LLP

(57) ABSTRACT

A receiver is disclosed. The receiver includes an amplifier and a bias circuit configured to provide a bias current to the amplifier. The bias circuit is self biasing. The bias circuit is also configured to adjust the bias current using positive feedback from the amplifier.

17 Claims, 4 Drawing Sheets

SELF-BIASED RECEIVER

BACKGROUND

1. Field

The present disclosure relates generally to electronic circuits, and more particularly, to a self-biased receiver.

2. Background

With the ever increasing demand for more processing capability of integrated circuits or "chips," low power consumption has become a key design requirement. Various techniques are currently employed to reduce power consumption in such devices. One such technique involves reducing the operating voltage of certain circuits operating on the "chip" during certain modes of operation.

The integrated circuit is generally designed with a large number of standard cells distributed across the "core" of the chip. Each cell is formed with any numbers of transistors that work together to provide a functional unit. These cells are interconnected together to form an operational device. The core is surrounded by a number of larger cells arranged along the periphery of the chip. The larger cells contain input/output (I/O) drivers formed with transistors having wider channel lengths, thicker oxide layers, and higher threshold voltages to interface with higher voltage off-chip devices. An example of an I/O driver is a self-biased differential receiver. The self-biased receiver performs well in the presence of process, voltage and temperature ("PVT") variations, but may exhibit inter-symbol interference ("ISI") jitter and duty cycle distortion ("DCD") when the operating voltage is reduced in a power savings mode. The ISI jitter and DCD can reduce the usable data rate for the self-biased differential receiver.

SUMMARY

One aspect of a receiver includes an amplifier and a bias circuit configured to provide bias current to the amplifier in response to a bias voltage produced by the amplifier, wherein the bias circuit includes a first circuit configured to provide self biasing of the receiver by adjusting the bias current using the feedback from the amplifier and a second circuit configured to further adjust the bias current using additional feedback from the amplifier.

One aspect of a method of receiving a signal includes providing a bias current to an amplifier from a bias circuit in response to a bias voltage produced by the amplifier, wherein the bias circuit includes a first circuit configured to provide self biasing of the receiver by adjusting the bias current using the feedback from the amplifier and a second circuit configured to further adjust the bias current using additional feedback from the amplifier.

Another aspect of a receiver includes an amplifying means for amplifying a signal, and a biasing means for providing a bias current to the amplifying means in response to a bias voltage produced by the amplifier, wherein the biasing means includes a first circuit means for providing self biasing of the receiver by adjusting the bias current using the feedback from the amplifier and a second circuit means for adjusting the bias current using additional feedback from the amplifying means.

It is understood that other aspects of apparatus and methods will become readily apparent to those skilled in the art from the following detailed description, wherein various aspects of apparatuses, methods and articles of manufacture are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of apparatuses and methods will now be presented in the detailed description by way of example, and not by way of limitation, with reference to the accompanying drawings, wherein.

DETAILED DESCRIPTION

Figure 1:
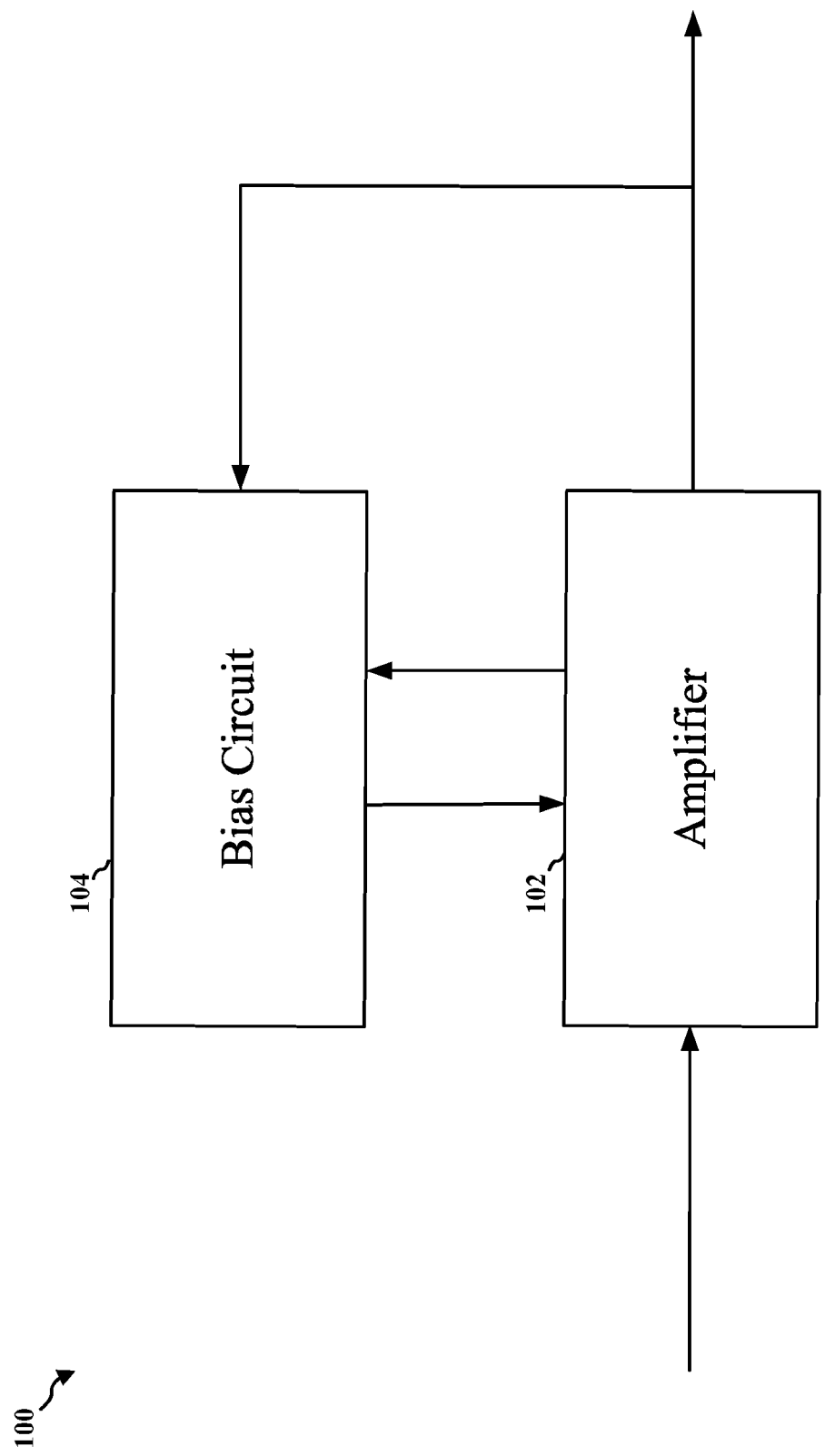
FIG. 1 is a functional block diagram illustrating one example of a receiver.

Various aspects of the disclosure will be described more fully hereinafter with reference to the accompanying drawings. This disclosure may, however, be embodied in many different forms by those skilled in the art and should not be construed as limited to any specific structure or function presented herein. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of this disclosure, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of this disclosure. It should be understood that any aspect of the disclosure disclosed herein may be embodied by one or more elements of a claim.

Although particular aspects will be described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different circuits, technologies, systems, networks, and methods, some of which are illustrated by way of example in the figures and in the following description. The detailed description and drawings are merely illustrative of the disclosure rather than limiting, the scope of the disclosure being defined by the appended claims and equivalents thereof.

The various circuits described throughout this disclosure may be implemented in various forms of hardware. By way of example, any of these circuits, either alone or in combination, may be implemented as an integrated circuit, or as part of the design of an integrated circuit. The integrated circuit may be an end product, such as a microprocessor, a digital signal processor (DSP), an application specific integrated circuit (ASIC), programmable logic, memory, or any other suitable integrated circuitry. Alternatively, the integrated circuit may be integrated with other chips, discrete circuit elements, and/or other components as part of either an intermediate product, such as a motherboard, or an end product. The end product can be any suitable product that includes integrated circuits, including by way of example, a cellular phone, a personal digital assistant (PDA), laptop computer, a desktop computer (PC), a computer peripheral device, a multimedia device, a video device, an audio device, a global positioning system (GPS), a wireless sensor, or any other suitable device.

Various aspects of a receiver will now be presented with reference to FIG. 1. These aspects are well suited for a receiver operating on a chip as an I/O device, but as those skilled in the art will readily appreciate, these aspects may be extended to other receivers and suitable circuits. Turing to FIG. 1, a functional block diagram illustrating an example of a receiver is shown. The receiver 100 includes an amplifier 102. The amplifier 102 provides a means for amplifying a signal. In the case of an I/O driver, the amplifier 102 may be implemented as a differential amplifier to increase the common mode rejection ratio (CMRR), but may be implemented differently for other applications. The differential amplifier may be configured to have either a differential or a single-ended output depending upon the particular application and overall design constraints. The receiver 100 also includes a bias circuit 104. The bias circuit 104 provides a means for providing a bias current to the amplifier 102. The receiver 100 may be self-biased. That is, the bias circuit 104 receives its bias voltage from the differential amplifier 102 in the form of negative feedback. Alternatively, the receiver 100 may have a fixed bias circuit which receives its bias voltage from a voltage source independent of the differential amplifier. The bias circuit 104 may also use feedback from the output of amplifier 102 to increase the bias current provided to the amplifier 102. The increased bias current may tend to reduce ISI jitter and DCD when the operating voltage is reduced in a power savings mode.

Figure 2:
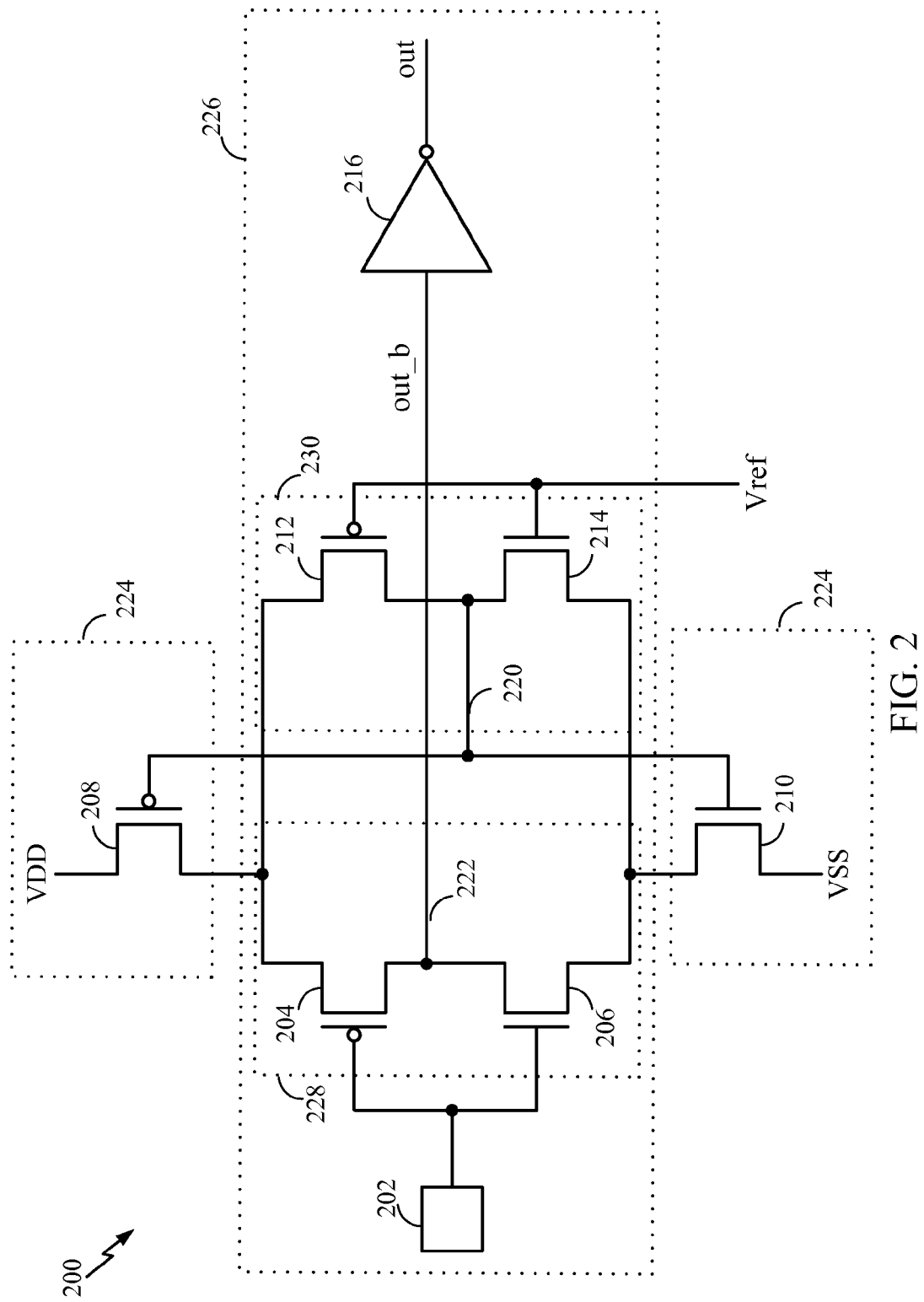
FIG. 2 is a schematic diagram illustrating an example of a receiver with an amplifier and a bias circuit.

FIG. 2 is a schematic diagram illustrating an example of a receiver 200 with an amplifier 226 and a bias circuit 224. In this example, the amplifier 226 is implemented as a differential amplifier, but may be implemented differently in other embodiments. The differential amplifier 226 includes a first amplifier 228 and a second amplifier 230 that operate together to amplify the difference between the voltage of an input signal 202 and a reference voltage $V_{ref}$. The first amplifier 228 is shown as a CMOS amplifier with PMOS transistor 204, an NMOS transistor 206, a signal input 202, and an output 222 that is provided to an inverter 216. The inverter 216 provides a single-ended output to a remote circuit or load. The second amplifier 230 is also shown as a CMOS amplifier with a PMOS transistor 212, an NMOS transistor 214, and an input tied to the reference voltage $V_{ref}$. The output from the second amplifier 230 provides a bias voltage 220 which is applied to the bias circuit 224.

The bias circuit 224 includes a circuit comprising a PMOS transistor 208 and an NMOS transistor 210. The PMOS transistor 208 is coupled between the positive supply rail $V_{DD}$ and the amplifier 226 and the NMOS transistor 210 is coupled between the amplifier 226 and the negative supply rail $V_{ss}$. The bias voltage 220 from the amplifier 226 is fed back to the gates of the PMOS transistor 208 and the NMOS transistor 210 bias to the transistors 204, 206, 212, 214 in the amplifier 226. For example, the voltage $V_{ref}$ may be biased as half of VDD.

By coupling the bias voltage 220 to the gates of the PMOS transistor 208 and the NMOS transistor 210, a negative feedback loop is created that stabilizes the bias voltage 220. Any increase in the bias voltage 220 due to PVT effects will increase the gate-to-source voltage $V_{GS}$ of the NMOS transistor 210. This will reduce the "on" resistance of the NMOS transistor 210, which in turn will pull down the bias voltage 220 towards the negative supply rail $V_{ss}$. Conversely, if the bias voltage 220 decreases due to PVT effects, the magnitude of the gate-to-source voltage $V_{GS}$ of the PMOS transistor 208 will increase. This will reduce the "on" resistance of the PMOS transistor 208, which in turn will pull up the bias voltage 220 towards the positive supply rail $V_{DD}$.

As discussed earlier, when the operating voltage (VDD) of the receiver 200 is reduced in a low power mode, the performance could suffer. By way of example, the transistors in a receiver configured as an I/O driver for an integrated circuit may have a threshold voltage $V_{TH}$ that is greater than 600 mV due to its thick oxide layer. This would limit the operating voltage in the low power mode to 1.2 V. If the operating voltage (VDD) were 1.1 V, for example, the gate-to-source voltage $V_{GS}$ for each transistor 208, 210 would be approximately 550 mV, which is less than the threshold voltage $V_T$. As a result, a very small amount of bias current would be provided to the amplifier 226 because both transistors 208, 210 would be off. Under this condition, the receiver 200 may suffer from ISI jitter and DCD, which could reduce the maximum useable data rate of the receiver 200. When transistors 208 and 210 are off, there is no or very small current going through amplifier 226. As a result, the amplifier 226 cannot function at all, or has very low gain and low bandwidth which causes jitter and DCD.

Figure 3:
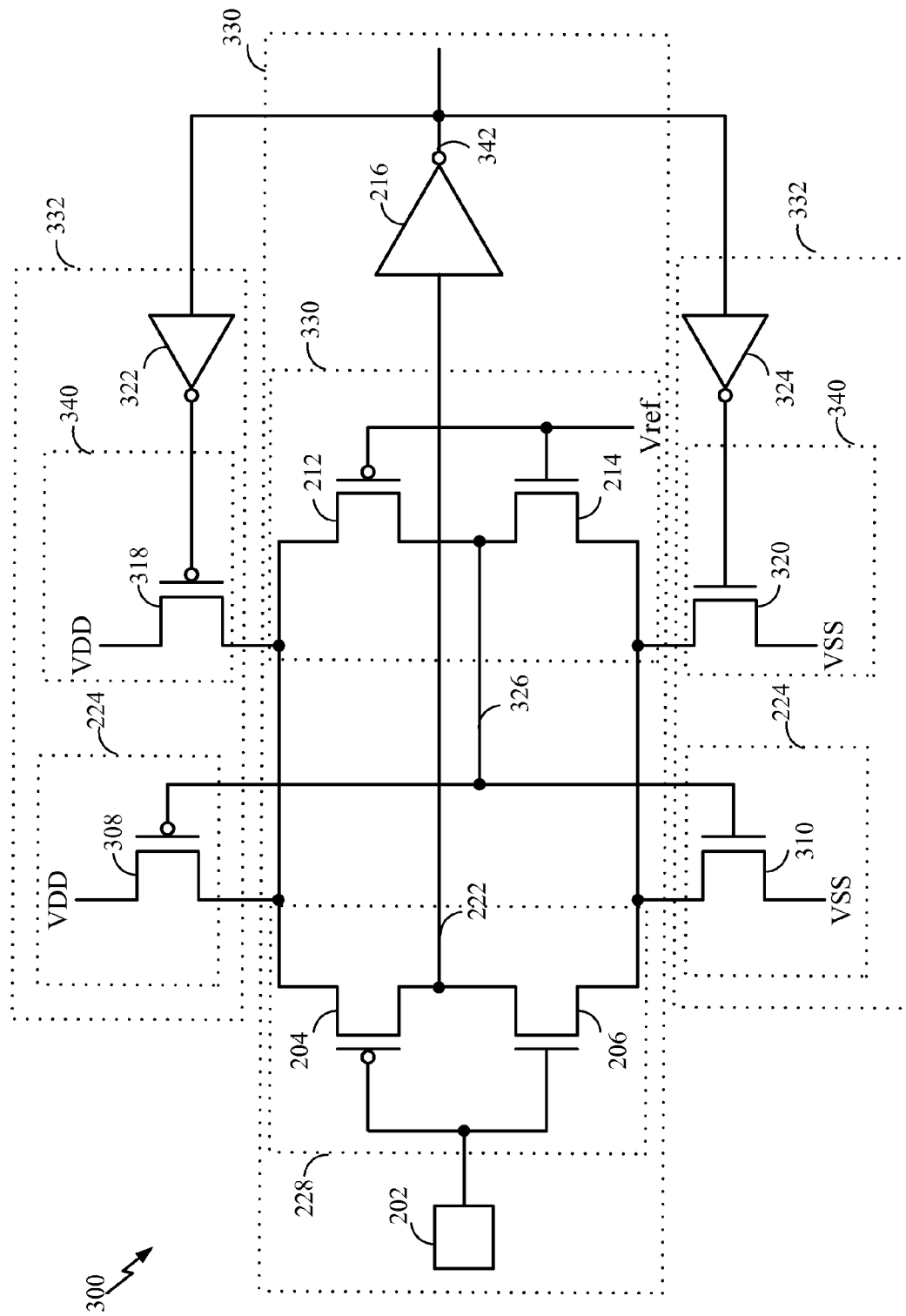
FIG. 3 is a schematic diagram illustrating an example of a receiver with an amplifier and a modified bias circuit.

FIG. 3 is an illustration of a receiver 300 with an amplifier 330 and a modified bias circuit 332. The modified bias circuit 332 includes the same circuit 224 that was described earlier in connection with FIG. 2 (bias circuit 224), which provides a means for adjusting the bias current using negative feedback to stabilize the bias voltage 326. The modified bias circuit also includes an additional circuit 340 comprising PMOS transistor 318 and NMOS transistor 320, which provides a means for adjusting the bias current using feedback. The PMOS transistor 318 is coupled between the positive supply rail $V_{DD}$ and the amplifier 330 and the NMOS transistor 320 is coupled between the amplifier 330 and the negative supply rail $V_{ss}$. The modified bias circuit 332 also includes two inverters 322 and 324, which are used to feed back the output from the amplifier 330 to the gates of transistors 318 and 320, respectively.

The modified bias circuit 332 uses feedback from the amplifier 330 to provide additional bias current. The additional bias current may enable the receiver 300 to perform better in a low power mode. By way of example, an operating voltage of 1.1 V would result in a bias voltage 326 applied to the gates of the PMOS and NMOS transistors 308, 310 of approximately 550 mV. This is less than the threshold voltage $V_T$ of both transistors, resulting in very little bias current to the amplifier 330. However, when the single-ended output 342 from the amplifier 330 is high, the PMOS transistor 318 is turned on and the NMOS transistor 320 is off. Since the gate-to-source voltage $V_{GS}$ of the PMOS transistor 318 is $V_{DD}$ (for example, 1.1V), which is much larger than the threshold voltage $V_T$ of the transistor 318, the transistor 318 is completely on, adding more bias current from the positive supply rail. The negative feedback of the amplifier 330 automatically increases the gate voltage at the input to the NMOS transistor 310. With a larger gate-to-source voltage $V_{GS}$, the transistor 310 starts to turn on, conducting more current until the current through the transistor 310 is the same as the current through the PMOS transistor 318. It ends at a stable state with both transistors 310 and 318 on and the current through the transistors 310 and 318 being equal. Conversely, when the single-ended output 342 from the amplifier 330 is low, the NMOS transistor 320 is turned on and the PMOS transistor 318 is off. Since the $V_{GS}$ of the NMOS transistor 320 is $V_{DD}$ (for example, 1.1V at minimum), which is much larger than threshold voltage $V_T$ of the transistor 320, the transistor 320 is completely on, sinking more current through the negative supply rail. The negative feedback of amplifier 330 automatically decreases gate voltage of the PMOS transistor 308. With a larger gate-to-source voltage $V_{GS}$, the PMOS transistor 308 starts to turn on, conducting more current until current through the transistor 308 is the same as current through the NMOS transistor 320. It ends at a stable state with both transistors 308 and 320 on and the current through the transistors being equal. Furthermore, a size ratio of transistors 318 and 320 may be less than a size ratio of transistors 308 and 310. A size ratio is defined as the size of a first transistor divided by a second transistor. For example, a size ratio of transistors 318 and 320 would be the size of transistor 318 divided by the size of transistor 320.

Figure 4:
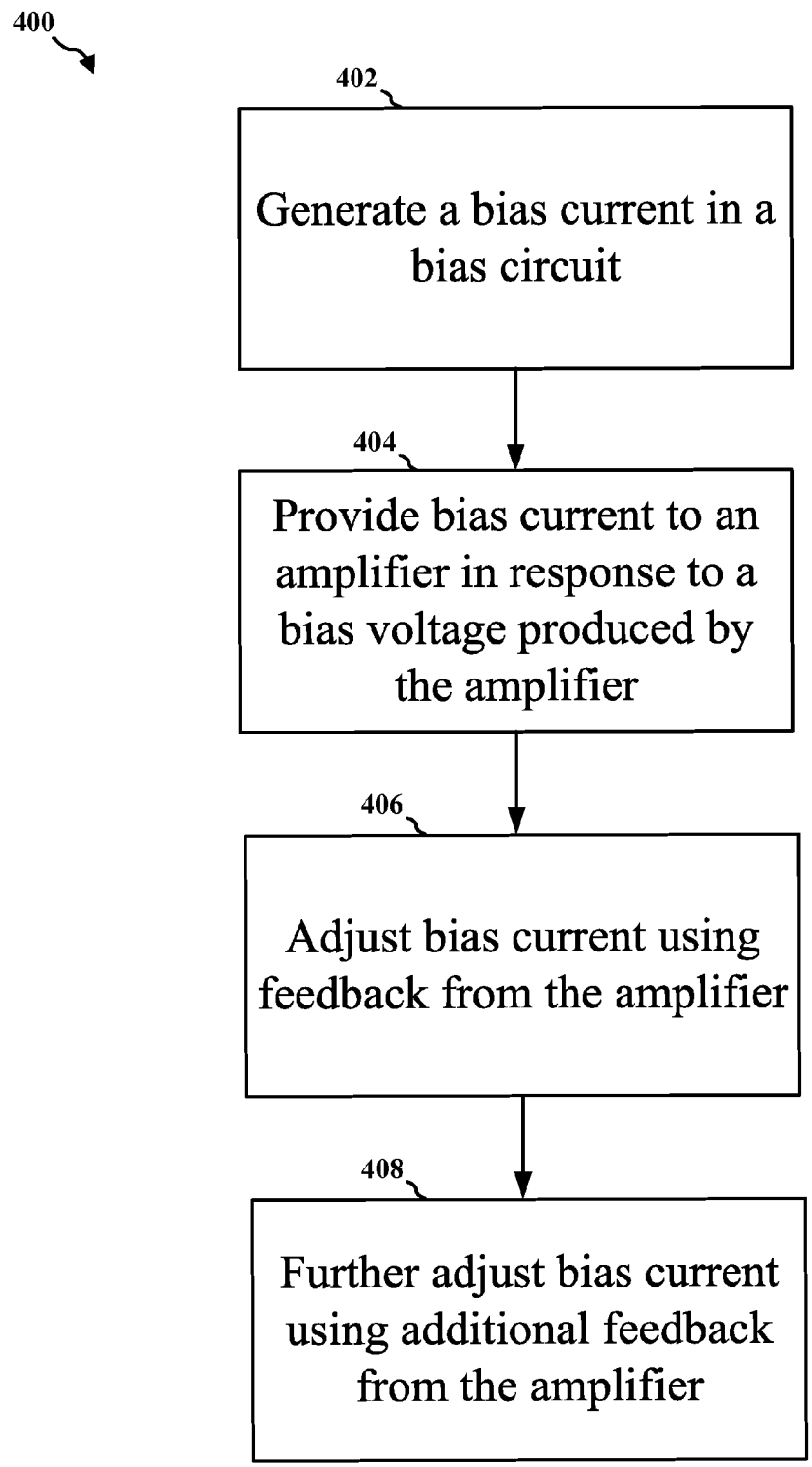
FIG. 4 is a flow chart illustrating an example of the operation of an amplifier and a bias circuit.

FIG. 4 is a flow chart 400 illustrating an example of the operation of an amplifier and a bias circuit. In block 402, the bias circuit provides bias current to the amplifier. In block 404, the bias circuit provides a bias current to an amplifier in response to a bias voltage produced by the amplifier. The bias circuit may adjust the bias current using negative feedback from the amplifier in response to variations in the bias voltage resulting from PVT variations. Alternatively, or in addition to, the bias circuit may adjust the bias current using feedback from the amplifier to add more bias current to allow the receiver to better perform in a low power mode. In block 406 the bias current may be adjusted using feedback from the amplifier and in block 408 the bias current may be further adjusted using additional feedback from the amplifier.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112(f), unless the element is expressly recited using the phrase "means for" or, in the case of a method claim, the element is recited using the phrase "step for."

What is claimed is:

1. A receiver, comprising:
   an amplifier; and
   a bias circuit configured to provide bias current to the amplifier in response to a bias voltage produced by the amplifier, wherein the bias circuit comprises a first circuit configured to provide self biasing of the receiver by adjusting the bias current using feedback from the amplifier and a second circuit configured to further adjust the bias current using additional feedback from the amplifier,
   wherein the first circuit is further configured to adjust the bias current using negative feedback from the amplifier, and
   wherein the second circuit comprises a first transistor configured to provide a source for the bias current and a second transistor configured to provide a sink for the bias current.

2. The receiver of claim 1, wherein the second circuit is further configured to turn on the first transistor and turn off the second transistor when an output from the amplifier is in a first state, and turn off the first transistor and turn on the second transistor when the output from the amplifier is in a second state different from the first state.

3. The receiver of claim 1, wherein the first circuit comprises a first transistor and a second transistor, and wherein a size ratio of the first and second transistors of the second circuit is less than a size ratio of the first transistor and the second transistor of the first circuit.

4. The receiver of claim 1, wherein the amplifier comprises first and second amplifiers, the first amplifier having an output coupled to the second circuit and the second amplifier having an output coupled to the first circuit.

5. The receiver of claim 4 wherein the amplifier has a single-ended output comprising the output from the first amplifier.

6. A method of receiving a signal, comprising:
   providing a bias current to an amplifier from a bias circuit in response to a bias voltage produced by the amplifier, wherein the bias circuit comprises a first circuit configured to provide self biasing of a receiver by adjusting the bias current using a feedback from the amplifier and a second circuit configured to further adjust the bias current using additional feedback from the amplifier; and
   adjusting the bias current using negative feedback from the amplifier,
   wherein the second circuit comprises a first transistor configured to provide a source for the bias current and a second transistor configured to provide a sink for the bias current.

7. The method of claim 6, further comprising:
   turning on the first transistor and turning off the second transistor when an output from the amplifier is in a first state; and
   turning off the first transistor and turning on the second transistor when the output from the amplifier is in a second state different from the first state.

8. The method of claim 6, wherein the amplifier comprises first and second amplifiers, the first amplifier having an output coupled to the second circuit and the second amplifier having an output coupled to the first circuit.

9. The method of claim 8 wherein the amplifier has a single-ended output comprising the output from the first amplifier.

10. A receiver comprising:
    amplifying means for amplifying a signal; and
    biasing means for providing a bias current to the amplifying means in response to a bias voltage produced by the amplifying means, wherein the biasing means comprises a first circuit means for providing self biasing of the receiver by adjusting the bias current using feedback from the amplifying means and a second circuit means for adjusting the bias current using additional feedback from the amplifying means,
    wherein the first circuit means is further configured to adjust the bias current using negative feedback from the amplifying means, and
    wherein the second circuit means comprises a first transistor configured to provide a source for the bias current and a second transistor configured to provide a sink for the bias current.

11. The apparatus of claim 10, wherein the second circuit means is further configured to turn on the first transistor and turn off the second transistor when an output from the amplifying means is in a first state, and turn off the first transistor and turn on the second transistor when the output from the amplifying means is in a second state different from the first state.

12. The apparatus of claim 10, wherein the first circuit means comprises a first transistor and a second transistor, and wherein a size ratio of the first and second transistors of the second circuit means is less than a size ratio of the first transistor and the second transistor of the first circuit means.

13. The apparatus of claim 10, wherein the amplifying means comprises first and second amplifiers, the first amplifier having an output coupled to the second circuit means and the second amplifier having an output coupled to the first circuit means.

14. The apparatus of claim 13 wherein the amplifying means has a single-ended output comprising the output from the first amplifier.

15. A receiver, comprising:
an amplifier; and
a bias circuit configured to provide bias current to the amplifier in response to a bias voltage produced by the amplifier, wherein the bias circuit comprises a first circuit configured to provide self biasing of the receiver by adjusting the bias current using feedback from the amplifier and a second circuit configured to further adjust the bias current using additional feedback from the amplifier,
wherein the first circuit is further configured to adjust the bias current using negative feedback from the amplifier,
wherein the amplifier comprises first and second amplifiers, the first amplifier having an output coupled to the second circuit and the second amplifier having an output coupled to the first circuit, and
wherein the amplifier has a single-ended output comprising the output from the first amplifier.

16. A method of receiving a signal, comprising:
providing a bias current to an amplifier from a bias circuit in response to a bias voltage produced by the amplifier, wherein the bias circuit comprises a first circuit configured to provide self biasing of a receiver by adjusting the bias current using a feedback from the amplifier and a second circuit configured to further adjust the bias current using additional feedback from the amplifier; and
adjusting the bias current using negative feedback from the amplifier,
wherein the amplifier comprises first and second amplifiers, the first amplifier having an output coupled to the second circuit and the second amplifier having an output coupled to the first circuit, and
wherein the amplifier has a single-ended output comprising the output from the first amplifier.

17. A receiver comprising:
amplifying means for amplifying a signal; and
biasing means for providing a bias current to the amplifying means in response to a bias voltage produced by the amplifying means, wherein the biasing means comprises a first circuit means for providing self biasing of the receiver by adjusting the bias current using feedback from the amplifying means and a second circuit means for adjusting the bias current using additional feedback from the amplifying means,
wherein the first circuit means is further configured to adjust the bias current using negative feedback from the amplifying means,
wherein the amplifying means comprises first and second amplifiers, the first amplifier having an output coupled to the second circuit means and the second amplifier having an output coupled to the first circuit means, and
wherein the amplifying means has a single-ended output comprising the output from the first amplifier.

\* \* \* \* \*